(12) United States Patent
Pani et al.

(10) Patent No.: US 7,368,943 B2
(45) Date of Patent: May 6, 2008

(54) ENHANCED SCHEME TO IMPLEMENT AN INTERCONNECTION FABRIC USING SWITCHING NETWORKS IN HIERARCHY

(75) Inventors: Peter M. Pani, Mountain View, CA (US); Benjamin S. Ting, Saratoga, CA (US)

(73) Assignee: Advantage Logic, Inc., Mountain View, CA (US)

( * ) Notice: Subject to any disclaimer, the term of this patent is extended or adjusted under 35 U.S.C. 154(b) by 69 days.

(21) Appl. No.: 11/392,411

(22) Filed: Mar. 28, 2006

(65) Prior Publication Data
US 2007/0236250 A1    Oct. 11, 2007

(51) Int. Cl.
*H01L 25/00* (2006.01)
*H03K 19/177* (2006.01)

(52) U.S. Cl. ............................ 326/41; 326/38; 326/47; 326/101; 716/12; 716/17

(58) Field of Classification Search ............ 326/37–39, 326/41, 47, 101; 716/12, 17
See application file for complete search history.

(56) References Cited

U.S. PATENT DOCUMENTS

| 5,357,152 A * | 10/1994 | Jennings et al. ............... 326/39 |
| 5,519,629 A * | 5/1996 | Snider ......................... 716/17 |
| 6,594,810 B1 * | 7/2003 | Reblewski et al. ........... 716/12 |

* cited by examiner

*Primary Examiner*—Rexford Barnie
*Assistant Examiner*—Crystal L Hammond
(74) *Attorney, Agent, or Firm*—Blakely, Sokoloff, Taylor & Zafman LLP

(57) ABSTRACT

An interconnection fabric using switching networks organized in multiple levels of hierarchy to allow flexible interconnections of the switching networks amongst different levels of hierarchy and on the same level of hierarchy. The resulting interconnection fabric can be used in electronic devices, such as switching networks, routers, and programmable logic circuits, etc.

21 Claims, 6 Drawing Sheets

ENHANCED SCHEME TO IMPLEMENT AN INTERCONNECTION FABRIC USING SWITCHING NETWORKS IN HIERARCHY

TECHNICAL FIELD

Embodiments of this invention relate to interconnection schemes using switching networks in hierarchy and in tandem to build an interconnection fabric for applications in communication networks such as routers and for programmable logic circuits.

BACKGROUND

A switching network is comprised of ports with pins, conductors and switches. The ports and pins are external constructs of the switching network where each port contains a plurality of pins to interface to other switching networks or circuits. The conductors and switches are internal constructs of the switching network configured to transfer data or signals from pins of a first plurality of ports to pins of a second plurality of ports of the switching network. The pins of the first plurality of ports receive data or signals and transmit those data or signals through the conductors and the switches of the switching network to the pins of the second plurality of ports. The switching network can be bi-directional and in this case the pins of the first plurality of ports and the second plurality of port can both receive and transmit data or signals through the conductors and switches of the switching network. The pins of the ports of the switching network are physically connected to respective conductors of the switching network. The switches of the switching network can be programmed, either one time or repeatedly, to enable connection paths among the pins of the first plurality of ports to the pins of the second plurality of ports. The connection paths connecting pins inside the switching network can sometimes involve one or more intermediate conductors coupled through switches of the switching network.

Generally, the transmission of data or signals from the first plurality of ports to the second plurality of ports through the switching network can either be single-casting, where a pin of the first plurality of ports connects to a pin of the second plurality of ports, or can be multi-casting where data or signals of a pin of the first plurality of ports are transmitted to multiple pins of respective multiple ports of the second plurality of ports. The switching network can be used in an interconnection fabric for systems, networks, and routers, etc. The switching network can also be used as programmable interconnect circuitry for programmable logic circuits. In the case of programmable logic circuits, the multicasting corresponds to a source (output) connecting to multiple sinks (inputs) which is generally expressed as the fan-out of an output or fan-in of the inputs. The convention stated thus far does not preclude nor restrict the switching network to be unidirectional where a signal flows only from a pin of the first plurality of ports to a pin of the second plurality of ports. Depending on actual circuit implementation, it is possible to allow a signal flowing from a pin of the second plurality of ports to flow to a pin of the first plurality of ports of the switching network.

FIG. 1 illustrates a conventional switching system using three levels of switching networks: four 11's: 11-1, 11-2, 11-3, 11-4 (L0's), two 12's: 12-1, 12-2 (L1's) and one 13 (L2) in hierarchy connecting to sixteen 10's: four 10-1, four 10-2, four 10-3, and four 10-4 functional blocks (FBs), where each FB in each 10-*i* can either be a switching network or logical circuits for i=[1:4]. Switching network 13 is the root network of the switching system illustrated in FIG. 1. In FIG. 1, 100 is labeled as signals "input" to one of the first plurality of ports of L2 switching network 13. 100 is a buss label of a plurality of conductors carry signals, each conductor in 100 connects to a respective pin in 100-Pins and those 100-Pins are pins of a port, 100-Port of one port of the first plurality of ports of switching network 13 as illustrated in FIG. 1. For ease and clarity of illustrations, the figures illustrating various embodiments of this disclosure will not label every pins and ports, instead, the conductors connecting to the pins of a port is labeled and the associated pins and ports will be made explicit in the discussions. Thus, as an example, 110-2 of FIG. 1 is associated with the pins of one of the second plurality of ports of switching network 13 connecting to the pins of one port of the first plurality of ports of switching network 12-2, where the pins and ports were not labeled in the illustration.

The pins in 101-*i* of the second plurality of ports from each FB of the four 10-*i*'s are connected, as pins of the first plurality of ports, to the respective direct ancestor 11-*i* (L0) in the switching system in FIG. 1. Thus, the pins 101-1 of the 10-1 containing the four FBs and 120-1 of switching network 12-1 together constitute the pins of the first plurality of ports of switching network 11-1 (L0); the pins 101-2 of the 10-2 containing the four FBs and 120-2 of switching network 12-1 together constitute the pins of the first plurality of ports of switching network 11-2 (L0); the pins 101-3 of the 10-3 containing the four FBs and 120-3 of switching network 12-2 together constitute the pins of the first plurality of ports of switching network 11-3 (L0) and the pins 101-4 of the 10-4 containing the four FBs and 120-4 of switching network 12-2 together constitute the pins of the first plurality of ports of switching network 11-4 (L0). Similarly, the pins 111-1 of second plurality of ports of switching network L0 11-1, the pins 111-2 of second plurality of ports of switching network L0 11-2 and the pins 110-1 of the second plurality of ports of switching network 13 constitute the pins of the first plurality of ports of switching network L1 12-1; the pins 111-3 of second plurality of ports of switching network L0 11-3, the pins 111-4 of second plurality of ports of switching network L0 11-4 and the pins 110-2 of the second plurality of ports of switching network 13 constitute the pins of the first plurality of ports of switching network L1 12-2. Additionally, the pins 121-1 of the second plurality of ports of switching network L1 12-1, the pins 121-2 of the second plurality of ports of switching network L1 12-2 and the pins of 100 constitute the pins of the first plurality of ports of switching network L2 13; the pins 131 of the second plurality of ports of switching network L2 13 constitute part of the pins of the first plurality of ports of yet another higher level of switching network. An example of such a switching system as illustrated in FIG. 1 was presented by Pani et al. in U.S. patent application Ser. No. 10/909,810, filed Jul. 29, 2004.

The hierarchical switching networks of FIG. 1 provides efficient signal paths from 100 of 13 (L2) to 130 of 10-*i* (FBs, i=[1:4]) through 12-*j* (L1) for j=[1,2] and 11-*i* (L0). In the case where the signals originated from one of the 10-*i* FB to another FB of a different 10-*j*, the signal path involves 101-*i* connecting through L0 switching network 11-*i*, to 111-*i* connecting through 12-1 or 12-2 to respective 121-1 or 121-2 connecting through 13 to 110-1 or 110-2, feeding into respective 12-1 or 12-2 to the respective 120-*j*, feeding through the respective 11-*j* to the respective 130 link of the destination FB of the 10-*j*.

However, the switching system in FIG. 1 suffers from some disadvantages. For instance, the speed of signal in the switching system is relatively slow because the signal path described above is relatively extensive. Additionally, the extensive signal path consumes significant amounts of interconnection and switching resources. As a result, the networks are typically sized up in anticipation of long signal paths in order to avoid compromising the connectivity of the interconnection fabric. Thus an improved scheme is desired both to improve the speed and to reduce the over-sizing of the switching networks.

BRIEF DESCRIPTION OF THE DRAWINGS

The objectives, features, and advantages of embodiments of the present invention will be apparent from the following detailed description in which.

DETAILED DESCRIPTION

Figure 1:
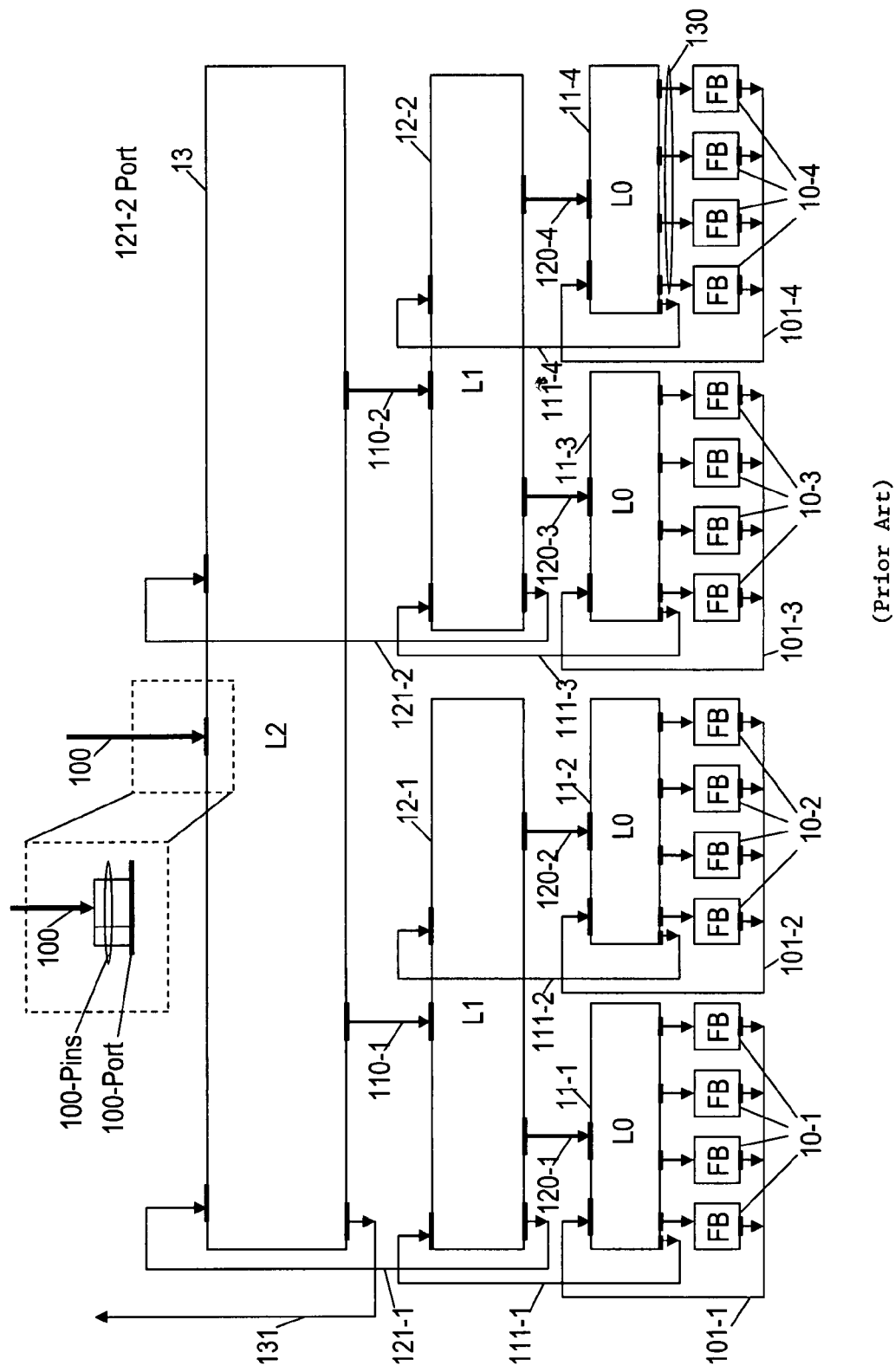
FIG. 1 illustrates a conventional switching system.

In the following description, for purposes of explanation, numerous specific details are set forth in order to provide a thorough understanding of embodiments of the present invention. It will be apparent to one skilled in the art that embodiments of the present invention may be practiced without these specific details. In other instances, well-known structures and circuits are shown in block diagram form in order to avoid unnecessarily obscuring embodiments of the present invention. For purpose of description, unless otherwise specified, the term "to connect" as used in the current description may include both to directly connect and to indirectly connect (for example, inserting a driver or repeater to boost signal strength). Likewise, the term "to couple" as used herein may include both to directly couple and to indirectly couple. The representations and embodiments of the figures show each level of hierarchy, where each parental switching network is connected, in most cases, to two direct descendants. One skilled in the art should appreciate that this is illustrative of cases in which each parental switching network have more than two children and not limiting. Furthermore, it should be readily understood that the size of each direct descendant or child amongst the children networks may or may not be the same.

The design of an integrated circuit (IC) requires that a layout be designed which specifies the arrangement of the various circuit components that will result on the major surface of the integrated circuit substrate; that is referred to as an integrated circuit layout. In generating integrated circuit layouts, designers may typically use electronic design automation ("EDA") tools. An EDA tool generates layouts by using geometric shapes that represent different materials and components on an integrated circuit. For example, an EDA tool may use rectangular lines to represent the conductors that interconnect integrated circuit components. An EDA tool may illustrate component ports with pins on their sides. These pins connect to the interconnect conductors. A net may be defined as a collection of pins that need to be electrically connected. A list of all or some of the nets in an integrated circuit layout is referred to as a netlist. A netlist specifies a group of nets, which, in turn, specify the required interconnections between a set of pins.

In one embodiment, a machine-readable medium may be used to store data representing an integrated circuit design layout. The integrated circuit layout may be generated using a netlist or other means, for examples, schematics, text files, hardware description languages, layout files, etc. The integrated circuit layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided herein.

In the physical layout of components of an integrated circuit, it is common to refer to a conductor laid out along either a first dimension as a horizontal wire or conductor in a track or along a second dimension as a vertical wire or conductor in a track belonging to a layer of interconnections. A track is a layout unit along a dimension where one or more conductors can be laid out co-linearly along the track while conforming to manufacturing process rules in the context of a given layer of interconnections. In some embodiments, a track can be along an angular direction such as forty-five degrees, hence when we refer to a dimension such as a first dimension or a second dimension, the track can either be horizontal, vertical or of an angular direction.

It should also be noted that some embodiments of the present invention use program control devices to set the states of switches utilized. The control devices may include single-use programmable control devices, such as fuse/anti-fuse technologies, or re-programmable control devices, such as SRAM (which is volatile), FLASH (which is non-volatile), Ferro-electric (which is non-volatile), etc. Moreover, embodiments of the present invention pertain to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferroelectric processes.

A switch connecting two wires or conductors usually has a control mechanism which can be programmed at least once. Once the control is determined and is programmed in a switch, the two conductors are either connected electrically or the circuit between the two conductors is "open" or non-conducting. There are multiple ways to implement a switch, depending on technology used and circuit design techniques. The control mechanism is generally a memory bit in re-programmable technology and anti-fuse programming lines in one-time programmable technology to select a conducting path between the two conductors through the switch. In the case where multiple numbers of incoming conductors are to be connected to a single source conductor, a multiplexer is commonly used to consolidate the many individual switches. It is generally preferable to implement the circuits of a switch or multiple consolidated switches in a contiguous area as a basic layout unit to reduce layout area.

Figure 2:
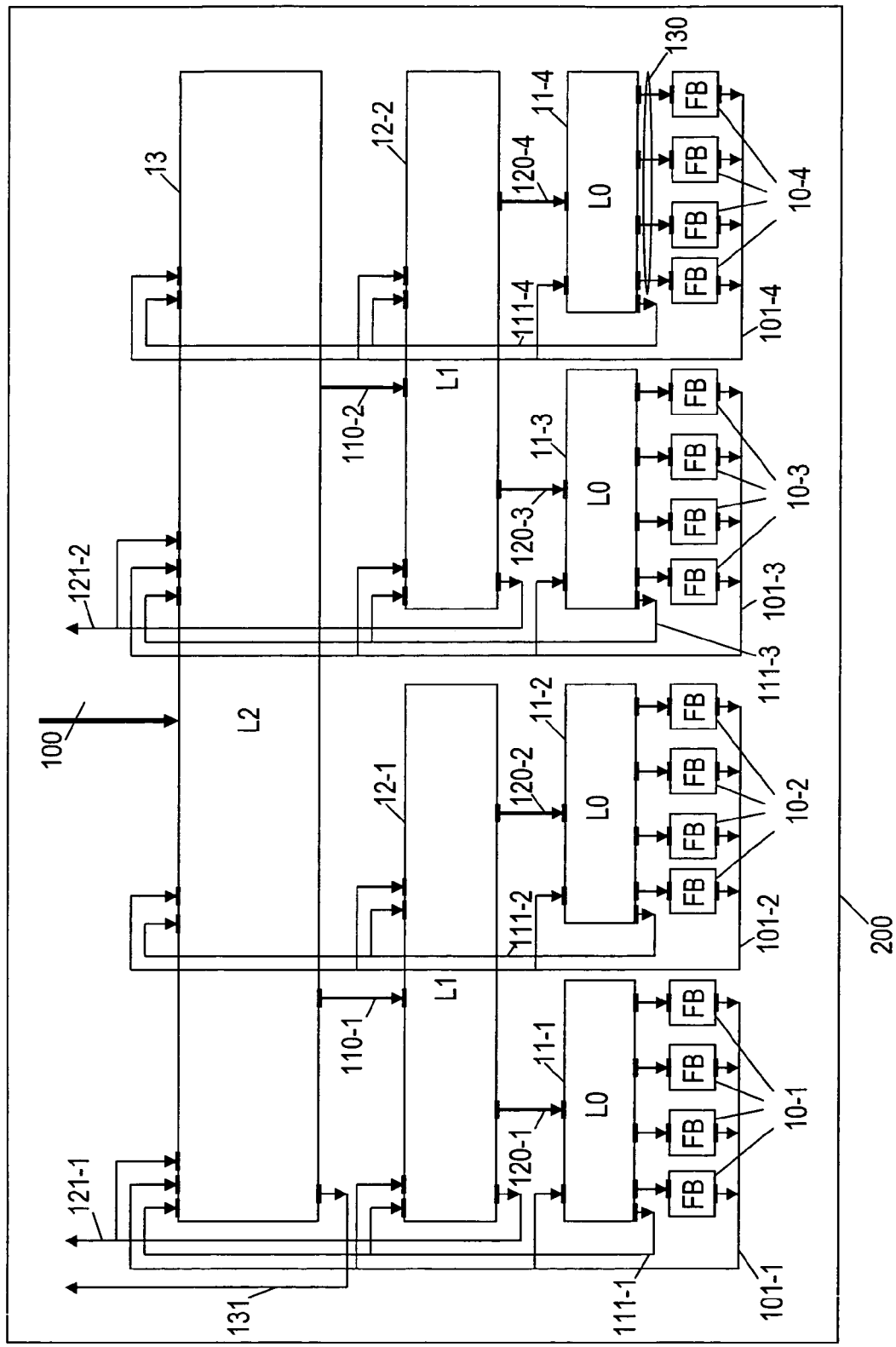
FIG. 2 illustrates one embodiment of a hierarchical switching system with signals feedback to multiple levels of hierarchy along direct ancestry.

FIG. 2 illustrates some embodiments of multiple levels of switching networks in an interconnection fabric. At each level of the hierarchy, a portion of the pins of a second plurality of ports of a parental switching network are connected to the pins of a first plurality of ports of direct descendant switching networks. For example, in FIG. 2, the second plurality of ports of parental switching network 13 include pins 110-1 and 110-2. Pins 110-1 connect parental switching network 13 to child switching network 12-1 and pins 110-2 connect parental switching network 13 to child switching network 12-2. The number of pins 131 may be less than the total number of pins 110-1 and 110-2. Similarly, the number of pins 121-1 may be less than the number of pins 120-1 and 120-2 in FIG. 2; the number of pins 121-2 is less than number of pins 120-3 and 120-4 in FIG. 2, etc. In some embodiments, one exception to the above illustration is at the lowest level of hierarchy, where the pins of the second plurality of ports of the functional block in 10-$i$ of FIG. 2. There may be no child for each of the FBs 10-$i$; instead, a majority, if not all, of the pins of the FBs 10-$i$ may be "fed-back" up the levels of the hierarchy to the ancestral switching networks, thus connecting to the pins of the first plurality of ports of the respective ancestral switching networks.

At each level of the hierarchy, a portion of the pins of the second plurality of ports of the switching network are connected to the first plurality of ports of direct ancestral networks along the hierarchy. In FIG. 2, the pins of the second plurality of ports 101-$i$ of the FBs groups 10-$i$ are connected to the pins of the first plurality of ports of respective direct ancestors 11-$i$ (L0), 12-$j$ (L1), where j=Integer (i/2) and 13 (L2). Similarly, some pins of the second plurality of ports of each level of switching networks feedback to respective direct ancestors, for example, 111-$i$ of 11-$i$ connects to the pins of the first plurality of ports of respective 12-1 or 12-2 and 13, etc.; 121-$i$ of respective 12-$i$ connects to the pins of the first plurality of ports of 13, etc., and 131 of 13 connects to the pins of higher level ancestral switching networks.

The embodiments of FIG. 2 outlined above may allow a lower level signal to "skip" the hierarchy, hence fewer number of switching and interconnection resources are used in the signal path through the interconnection fabric. Furthermore, it should be readily observed that, in general, there are fewer signals originating from a lower level to far flung destinations compared to more localized communications; this may be generally true in electronic systems, such as telecommunication systems, networks, or programmable circuits, etc. Thus the feedback traffic from the lower level, such as 101-$i$ of FIG. 2, to respective higher levels of ancestral networks may not be equal and not all the pins of 101-$i$ may be connected to all the respective higher levels of networks. The actual amount of respective connections between the pins of the second plurality of ports of a lower level switching network and the pins of switching networks of higher levels is a function of design objectives and planned traffic patterns in the switching system. It should also be appreciated that in the case described above, there may be specialized local-connections amongst the pins of the second plurality of ports of an originating FB of 10-$i$ of FIG. 2 to a destination FB of the same 10-$i$ or different 10-$j$ (not shown) without using the feedback loop of 101-$i$ to 11-$i$, etc., back down to the destination FB. The pins in 101-$i$ of FIG. 2 may or may not include all the pins of the second plurality of ports of the FBs in the respective 10-$i$.

In some embodiments, two switching networks are considered to be siblings when the two switching networks share a common parental switching network. For example, in FIG. 1 and FIG. 2, 11-1 and 11-2 are siblings having a common parent 12-1; 12-1 and 12-2 are siblings having a common parent 13, etc. It is contemplated that sibling network connections can be added where appropriate. For example, in FIG. 2, some pins of the second plurality of ports of parental switching network 11-$i$ can be connected to the pins of the first plurality of ports of a sibling switching network 11-$j$ where i is different from j and vice versa. For a signal originating from a lower level switching network connecting to a pin of a sibling switching network having a common parental switching network, the signal path, for example, from 111-1 of the lower level switching network 11-1 through the common parental switching network 12-1 connecting to the sibling network 11-2 through 120-2 is logically equivalent to the above described shortened path by connecting 111-1 directly to the first plurality of ports of 11-2 without going through the parental switching network 12-1. Again, the trade off between speed and sizing of respective switching networks may be made based on design objectives in the implementation of the interconnection fabric.

In some embodiments, two switching networks are considered to be cousin networks where the two switching networks do not share same direct parental network but have a common grandparent ancestral network. For example, in FIG. 2, each of the FBs in 10-$i$ are cousins of different FBs in different 10-$j$, where i is not equal to j; 11-2 and 11-3 are cousins for sharing the same grandparent switching network 13, etc. Similar schemes may be applied to cousin networks in addition to the sibling networks schemes described above.

Figure 3:
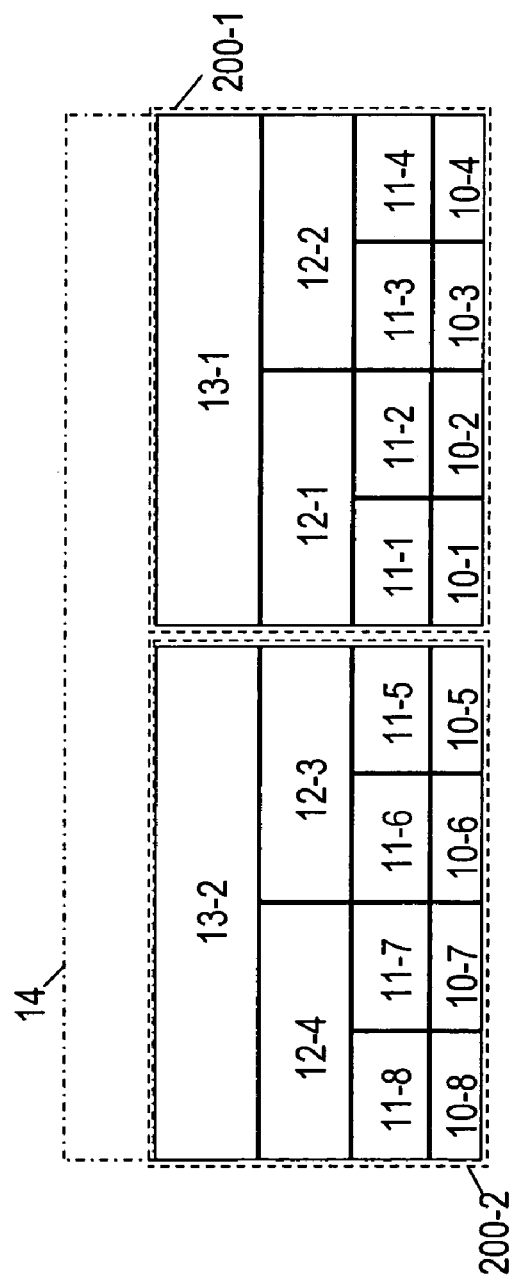
FIG. 3 illustrates one embodiment of a switching system comprising two hierarchical switching systems of FIG. 2 with a possible common parental switching network.

In some embodiments, two switching networks are considered to be tribal networks where the two switching networks are topologically adjacent, have respectively different ancestral networks at grandparent level, and share the same level of hierarchy topologically. The two tribal switching networks may be very distant cousins sharing a common ancestor (e.g., great-grandparents) switching network, or no common ancestry at all. FIG. 3 illustrates two hierarchical switching systems 200 of FIG. 2, where the definition of cousin networks and tribal networks may be better illustrated. Each of the functional blocks of 10-1 in 200-1 of FIG. 3 is of a different tribe from the rest of the functional blocks of 10-5 in 200-2. The switching network 11-1 in 200-1 of FIG. 3 is of a different tribe from the switching network 11-5 in 200-2. The switching network 12-1 in 200-1 of FIG. 3 is of a different tribe from the switching network 12-3 in 200-2 if the respective parental switching networks 13-1 and 13-2 do not share a common parental network. If the switching networks 13-1 and 13-2 share a common parental switching network 14, then the switching networks 12-1 and 12-3 are cousins.

The illustrations and embodiments of the multiple levels of hierarchical switching system in FIG. 1, FIG. 2 and FIG. 3 may have a symmetrical representation where, at each level of hierarchy, two parental networks have the same number of children networks whether the two parental networks are siblings, cousins, or of different tribes. It should be appreciated that the embodiments shown in FIG. 1, FIG. 2 and FIG. 3 are some examples to illustrate the concepts and are not intended to be restricting or limiting. Any two parental networks at the same level of hierarchy may or may not be of the same size, the respective children networks may or may not be of the same size, in either the number of children networks or the size of each respective child network. Thus, two sibling, cousin, or tribal networks may or may not be of the same size and may or may not have similar number of respective children networks. Furthermore, some portions of the switching system along a particular tribal network branch may have a Mega-functional Block. The Mega-functional Block may be a super regional switching network in a communication network or a mega cell, such as a microprocessor in a field programmable gate array circuit. There may be sideway communications to sibling, cousin, and/or tribal networks such that the Mega-functional Block may also be a sub-root of the particular tribal network branch.

Figure 4:
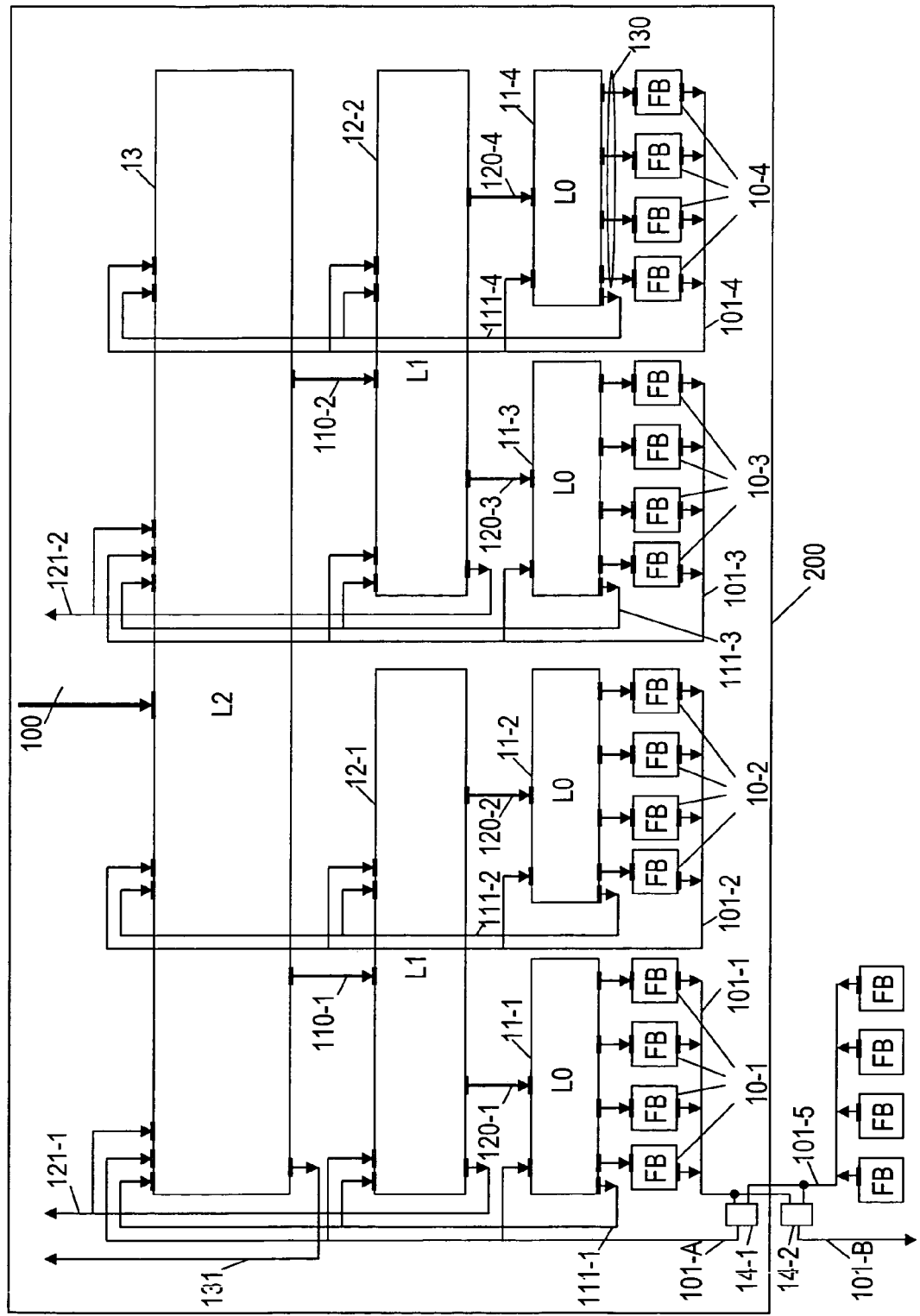
FIG. 4 illustrates some embodiments of feedback to multiple levels of hierarchy along relative ancestry for tribal networks.

FIG. 4 illustrates more embodiments in an interconnection scheme. 101-5 of FIG. 4 represents the pins of the second plurality of ports of functional blocks 10-5 which have different ancestral switching networks than the functional blocks of 10-1. Hence, the FBs of 10-5 and the functional blocks of 10-1 are of different tribes. Topologically, the two ancestral switching networks can be envisioned as adjacent to each other, either along a first dimension, or along a second dimension. Thus the switching networks or the FBs of 10-1 and 10-5 are tribal networks in FIG. 4. The pins of 101-1 and 101-5 are intermixed through 14-1 and 14-2 in FIG. 4 where the pins of the respective 101-A and 101-B may include a mixture of the pins of 101-1 and 101-5 feeding back to their respective ancestral switching networks.

The schemes outlined in the embodiments of FIG. 4 can be applied throughout the switching system hierarchy for sibling networks, cousin networks and/or tribal networks. The schemes may allow shortened communication paths between two higher level sibling, cousin, and/or tribal networks. Hence, signals may not propagate to the common parental network, and thus, speeding up the signal paths. Moreover, less interconnection and switching resources may be used in the overall switching system.

Figure 5:
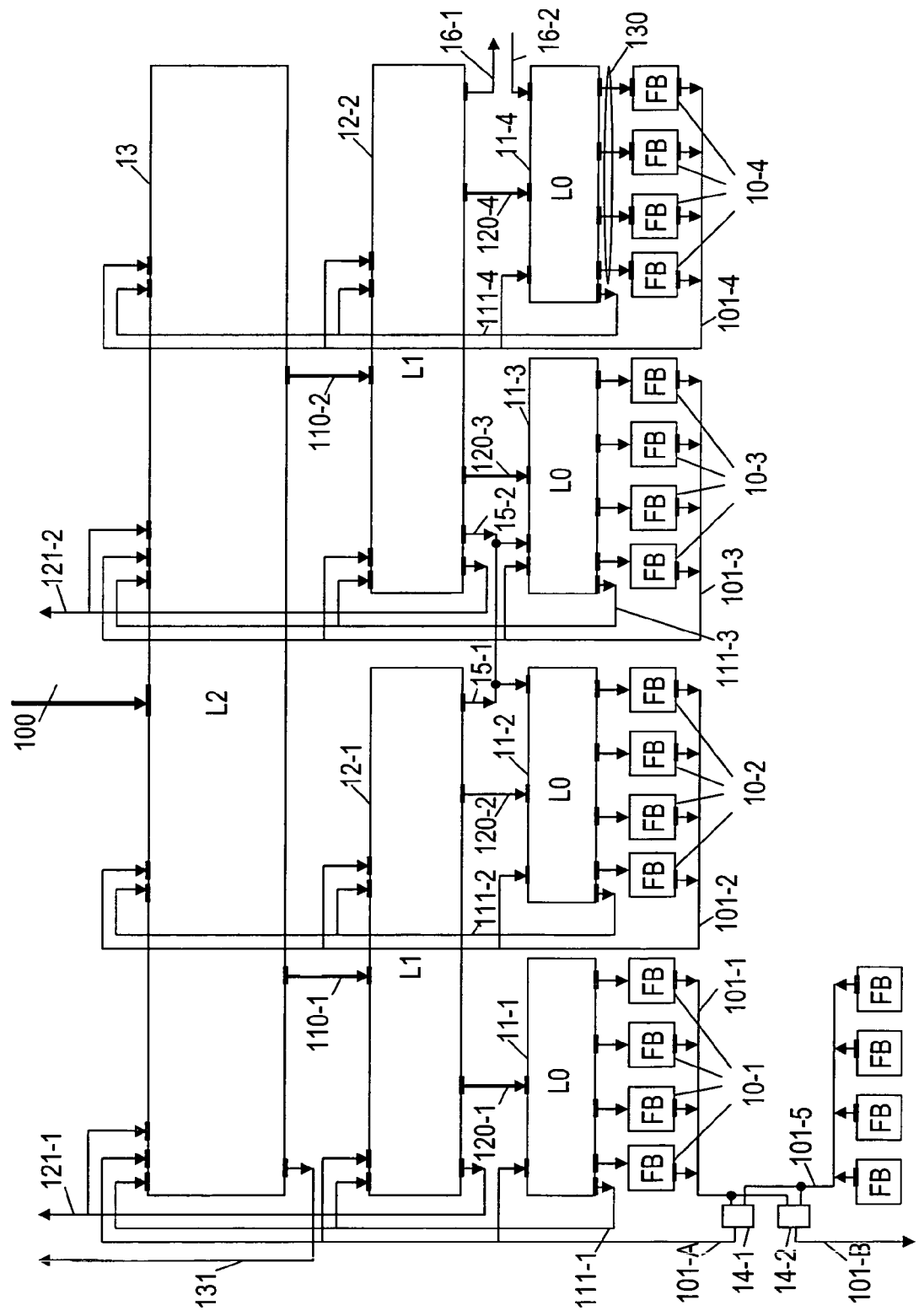
FIG. 5 illustrates some embodiments of sideway feeds to sibling networks, cousin networks and/or tribal networks.

The embodiments of FIG. 5 illustrate more localized interconnection improvements where little or no additional interconnection or switching resources are used. For example, in FIG. 4, a signal originating from a pin from one of the FBs in 10-1 connecting to a destination FB in 10-3 may take a shorter path starting with the pin of 101-1 through 14-1 to pin in 101-A through switching network 13 to a pin in 110-2 through switching network 12-2 to a pin in 120-3 through switching network 11-3 and connecting to a pin in the destination FB of 10-3. By sharing and intermixing some of the pins of the second plurality of ports of sibling switching networks 12-1 and 12-2, (such as pins in 15-1 and 15-2 connecting to the pins of the first plurality of ports of cousin switching networks 11-2 and 11-3 in FIG. 5), the alternative path for the example can be considerably improved. It is readily understood that in FIG. 5, the pins of 15-1 can either be shared or distributed to couple the respective switching networks 11-2 and 11-3, and similarly, pins of 15-2 can either be shared or distributed to couple the respective switching networks 11-2 and 11-3.

In some embodiments, the same pin from the FB in 10-1 connecting to the destination FB in 10-3 may take a shorter path starting with the pin of 101-1 through 14-1 to a pin in 101-A through switching network 12-1 to a pin in 15-1 through switching network 11-3 to the destination pin of the FB of 10-3 in FIG. 5. Similarly, two sibling networks at a given level of hierarchy may have intermixing of pins from the respective second plurality of ports to feed into the first plurality of ports of respective direct descendants (where those direct descendants are cousins). Again, there is very few or no additional devices in the scheme discussed above. The improvements may be achieved by sharing and intermixing the pins of 15-1 and 15-2 of FIG. 5 as part of the pins of the first plurality of ports in switching networks 11-2 and 11-3.

The scheme of intermixing the pins of 15-1 and 15-2 of FIG. 5 from two sibling networks can be extended to cover the case where the pins of second plurality of ports of two cousin or tribal networks are intermixed to feed into respective direct descendants. Note that the tribal networks may be very far distance cousins in terms of hierarchy. Alternatively, the tribal networks may not be cousins to each other at all. In FIG. 5, 16-1 represents pins of one of the port of the second plurality of ports of 12-2 feeding into switching network L0 11-5 (not shown) connecting to the pins of the first plurality of ports of 11-5, where 11-5 and 11-4 are either cousins or of different tribes. The ancestral networks of 11-4 and the ancestral networks of 11-5 (not shown) are considered adjacent to each other in this scheme. Switching networks 11-4 and 11-5 are cousins if the respective parental switching networks 13 and 13-2 (not shown) share a common parental switching network; otherwise, switching networks 11-4 and 11-5 are tribal networks. Thus 16-2 of FIG. 5 represents the pins of the second plurality of ports of 12-3 (not shown) feeding into switching network 11-4 connecting to the pins of the first plurality of ports of 11-4. One benefit of this scheme is to allow shorter connection paths, thus improving the speed of the switching system and reducing the interconnection and switching resources requirements of the switching system. Again, by taking advantage of certain topological adjacency of switching networks (of siblings, cousins, and tribes), interconnection resources of a switching system can be shared and used to perform multiple functions (e.g., feedbacks to different ancestral networks, feed forward to a sibling's direct descendants, feed forward to a tribe's direct descendants, etc.).

Figure 6:
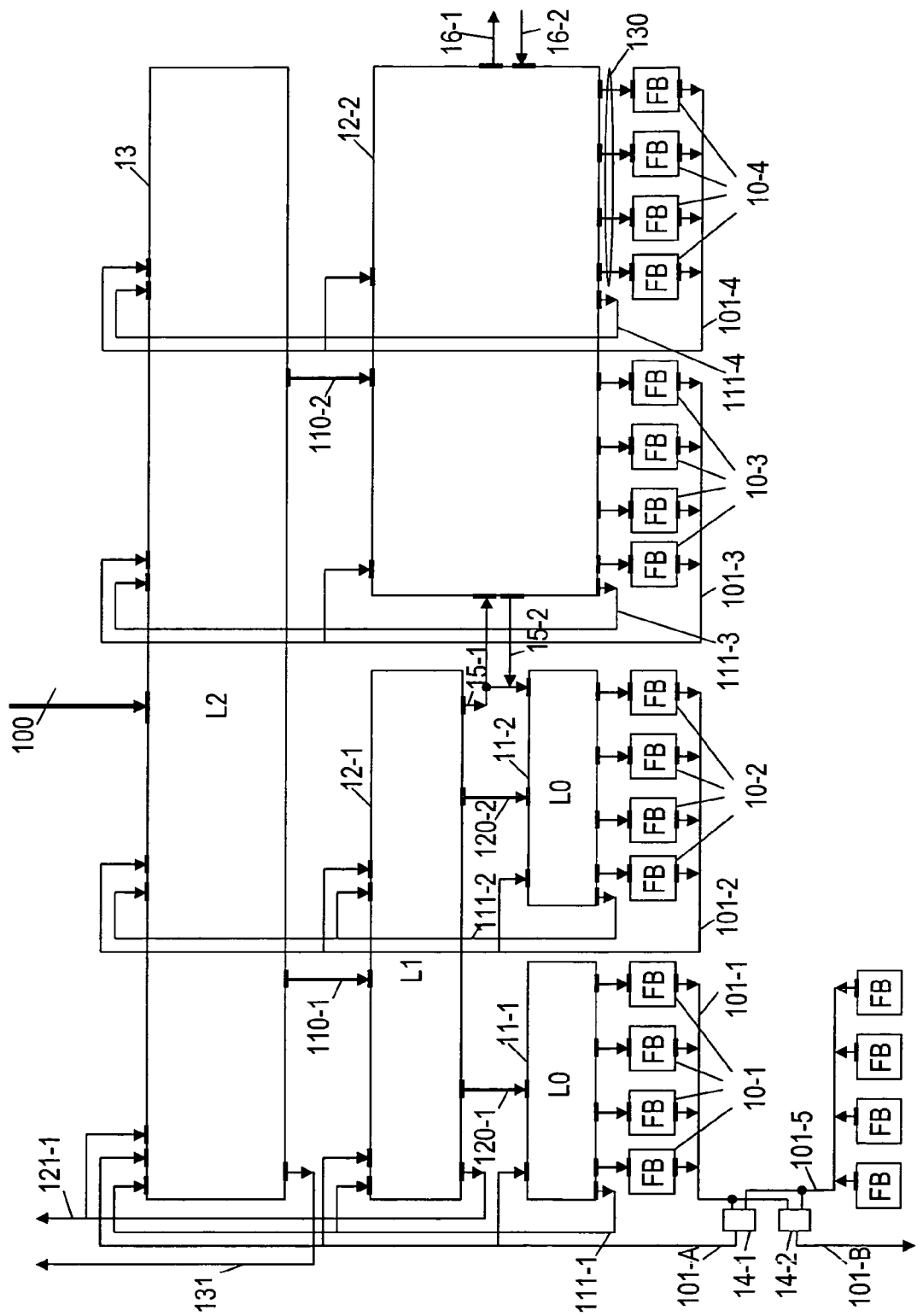
FIG. 6 illustrates alternative embodiments where an embedded functional block (Mega-functional Block) replacing one or more levels of a branch of the switching network system.

FIG. 6 illustrates one embodiment of a Mega-functional Block 12-2 used in place of switching networks 11-3, 11-4 and 12-2 of FIG. 5. As discussed earlier, Mega-functional Block 12-2 of FIG. 6 may either be a switching network which consolidates multiple levels of hierarchy of switching networks into one switching network in the switching system or may be mega cell circuitry, such as a microprocessor, a digital signal processor in a programmable logic circuit, etc. In some embodiments, 12-2 of FIG. 6 is both sibling to switching network 12-1 and cousins of twitching networks 11-1 and 11-2. Side-way coupling scheme of 15-1 and 15-2 described in FIG. 5 above thus can be applied to the Mega-functional Block 12-2 as illustrated in FIG. 6, treating Mega-functional Block 12-2 of FIG. 6 as switching network 11-3 of FIG. 5. Furthermore, Mega-functional Block 12-2 of FIG. 6 may also be considered as of different tribes to an adjacent network (not shown) of the same hierarchy as switching networks 11-1 and 11-2, having a corresponding L2 level switching network as ancestor, which is a sibling to 13. Thus, the side-way coupling scheme of switching networks 16-1 and 16-2 described in FIG. 5 above may be applied to Mega-functional Block 12-2 as illustrated in FIG. 6, treating Mega-functional Block 12-2 of FIG. 6 as both switching networks 11-4 and 12-2 of FIG. 5. The actual respective interconnection interface of the Mega-functional Block 12-2 in FIG. 6 to its parental, descendent, sibling, cousin and tribal networks can either be a programmable bus system having a tri-state control or a switching interface to enable more flexible pin-specific selections in the interconnection interface.

Thus, various embodiments of a scheme in providing a switching system by hierarchical interconnecting and coupling switching networks in an interconnection fabric have been described. Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An interconnection fabric in an integrated circuit, comprising:
    a root network;
    a first plurality of switching networks;
    a second plurality of switching networks, each network of the root network, the first plurality of switching networks, and the second plurality of switching networks comprising a respective first plurality of ports and a respective second plurality of ports, conductors, and switches, wherein each port of the first plurality of ports and the second plurality of ports comprises a plurality of pins, the switches selectively connecting the plurality of pins, wherein the pins of the first plurality of ports to selectively couple to the pins of the second plurality of ports through switches of the respective network;
    a third plurality of switching networks, each of the third plurality of switching networks comprising a first plurality of ports and a second plurality of ports, conductors, and switches, wherein each port of the first plurality of ports and the second plurality of ports comprises a plurality of pins, the switches selectively connecting the plurality of pins, wherein a plurality of pins of a respective port of the second plurality of ports of the root network are connected to the pins of a respective port of the first plurality of ports of a respective network of the first plurality of switching networks, wherein a plurality of pins of a respective port of the second plurality of ports of each of the first plurality of switching networks are connected to the pins of a respective port of the first plurality of ports of a respective direct descendant network of the second plurality of switching networks, wherein a plurality of pins of a respective port of the second plurality of ports of each of the second plurality of switching networks are connected to the pins of a respective port of the first plurality of ports of a respective direct descendant network of the third plurality of switching networks, and wherein a plurality of pins of a first port of the second plurality of ports of a first switching network of the third plurality of switching networks are connected to the pins of a plurality of ports selected from the first plurality of ports of respective ancestral networks of the root network, the first plurality of switching networks and the second plurality of switching networks.

2. The interconnection fabric of claim 1, wherein a respective number of pins of the first port connected to a respective port of the ancestral network of the second plurality of switching networks is greater than or equal to a respective number of pins of the first port connected to a respective port of the ancestral network of the first plurality of switching networks, and wherein a respective number of pins of the first port connected to the respective port of the ancestral network of the first plurality of switching networks is greater than or equal to a respective number of pins of the first port connected to the root network.

3. The interconnection fabric of claim 1, further comprising a second root network, a respective first plurality of switching networks, a respective second plurality of switching networks, a respective third plurality of switching networks and a respective first port, wherein a plurality of pins of the first port are connected to pins of at least a port selected from a port of a first plurality of ports of the second root network, a port of a first plurality of ports of at least one network of the respective first plurality of switching networks of the second root network, and a port of the first plurality of ports of at least one network of the respective second plurality of switching networks of the second root network.

4. The interconnection fabric of claim 1, wherein a first network of the third plurality of switching networks comprises a programmable logic cell.

5. The interconnection fabric of claim 1, wherein a second network of the first plurality of switching networks and the second plurality of switching networks comprises a plurality of cells to perform at least one of a logic function and a storage function.

6. The interconnection fabric of claim 1, wherein a plurality of pins of a respective port of the first plurality of ports of a first network of two cousin networks of the first plurality of switching networks, the second plurality of switching networks, and the third plurality of switching networks are connected to the pins of a respective port of the second plurality of ports of a parental network of a second network of the two cousin networks.

7. The interconnection fabric of claim 1, wherein a plurality of pins of a respective port of the first plurality of ports of a first network of two tribal networks of the first plurality of switching networks, the second plurality of switching networks, and the third plurality of switching networks are connected to pins of a respective port of the second plurality of ports of a parental network of a second network of the two tribal networks.

8. A method of providing an interconnection fabric in an integrated circuit, comprising:
    providing a root network, a first plurality of switching networks and a second plurality of switching networks;
    providing, in each network of the root network, the first plurality of switching networks and the second plurality of switching networks, a respective first plurality of ports, a respective second plurality of ports, a plurality of conductors, and a plurality of switches;
    providing a plurality of pins in each port of the first plurality of ports and the second plurality of ports, wherein the plurality of switches selectively connect to the plurality of pins; and
    selectively coupling the pins of the first plurality of ports to the pins of the second plurality of ports through switches of the respective network;
    providing a third plurality of switching networks, providing in each of the third plurality of switching networks a first plurality of ports and a second plurality of ports, a plurality of conductors, and a plurality of switches, and providing in each port of the first plurality of ports and the second plurality of ports a plurality of pins, the plurality of switches selectively connecting to the plurality of pins;

connecting a plurality of pins of a respective port of the second plurality of ports of the root network to the pins of a respective port of the first plurality of ports of a respective network of the first plurality of switching networks;

connecting a plurality of pins of a respective port of the second plurality of ports of each of the first plurality of switching networks to the pins of a respective port of the first plurality of ports of a respective direct descendant network of the second plurality of switching networks;

connecting a plurality of pins of a respective port of the second plurality of ports of each of the second plurality of switching networks to the pins of a respective port of the first plurality of ports of a respective direct descendant network of the third plurality of switching networks; and connecting a plurality of pins of a first port of the second plurality of ports of a first network of the third plurality of switching networks to the pins of a plurality of ports selected from the first plurality of ports of respective ancestral networks of the root network, the first plurality of switching networks and the second plurality of switching networks.

9. The method of claim 8, wherein a respective number of pins of the first port connected to a respective port of the ancestral network of the second plurality of switching networks is greater than or equal to a respective number of pins of the first port connected to a respective port of the ancestral network of the first plurality of switching networks, and wherein a respective number of pins of the first port connected to the respective port of the ancestral network of the first plurality of switching networks is greater than or equal to a respective number of pins of the first port connected to the root network.

10. The method of claim 8, further comprising:
connecting a second root network, a respective first plurality of switching networks, a respective second plurality of switching networks, and a respective third plurality of switching networks to a first port; and
connecting a plurality of pins of the first port to pins of at least a port selected from a port of a first plurality of ports of the second root network, a port of the first plurality of ports of at least one network of the respective first plurality of switching networks of the second root network, and a port of the first plurality of ports of at least one network of the respective second plurality of switching networks of the second root network.

11. The method of claim 8, wherein a first network of the third plurality of switching networks comprises a programmable logic cell.

12. The method of claim 8, wherein a second network of the first plurality of switching networks and the second plurality of switching networks comprises a plurality of cells to perform at least one of a logic function and a storage function.

13. The method of claim 8, further comprising:
selecting two cousin networks from the first plurality of switching networks, the second plurality of switching networks, and the third plurality of switching networks; and
connecting a plurality of pins of a respective port of the first plurality of ports of a first network of the two cousin networks to pins of a respective port of the second plurality of ports of a parental network of a second network of the two cousin networks.

14. The method of claim 8, further comprising:
selecting two tribal networks from the first plurality of switching networks, the second plurality of switching networks, and the third plurality of switching networks; and
connecting a plurality of pins of a respective port of the first plurality of ports of a first network of the two tribal networks to pins of a respective port of the second plurality of ports of a parental network of a second network of the two tribal networks.

15. An article of manufacture comprising a machine readable medium that stores data representing an integrated circuit layout, comprising:
a root network;
a first plurality of switching networks;
a second plurality of switching networks, each network of the root network, the first plurality of switching networks, and the second plurality of switching networks comprising a respective first plurality of ports and a respective second plurality of ports, conductors, and switches, wherein each port of the first plurality of ports and the second plurality of ports comprises a plurality of pins, the switches selectively connecting the plurality of pins, wherein the pins of the first plurality of ports to selectively couple to the pins of the second plurality of ports through switches of the respective network;
a third plurality of switching networks, each of the third plurality of switching networks comprising a first plurality of ports and a second plurality of ports, conductors, and switches, wherein each port of the first plurality of ports and the second plurality of ports comprises a plurality of pins, the switches selectively connecting the plurality of pins, wherein a plurality of pins of a respective port of the second plurality of ports of the root network are connected to the pins of a respective port of the first plurality of ports of a respective network of the first plurality of switching networks, wherein a plurality of pins of a respective port of the second plurality of ports of each of the first plurality of switching networks are connected to the pins of a respective port of the first plurality of ports of a respective direct descendant network of the second plurality of switching networks, wherein a plurality of pins of a respective port of the second plurality of ports of each of the second plurality of switching networks are connected to the pins of a respective port of the first plurality of ports of a respective direct descendant network of the third plurality of switching networks, and wherein a plurality of pins of a first port of the second plurality of ports of a first network of the third plurality of switching networks are connected to the pins of a plurality of ports selected from the first plurality of ports of respective ancestral networks of the root network, the first plurality of switching networks and the second plurality of switching networks.

16. The article of manufacture of claim 15, wherein a respective number of pins of the first port connected to a respective port of the ancestral network of the second plurality of switching networks is greater than or equal to a respective number of pins of the first port connected to a respective port of the ancestral network of the first plurality of switching networks, and wherein a respective number of pins of the first port connected to the respective port of the ancestral network of the first plurality of switching networks is greater than or equal to a respective number of pins of the first port connected to the root network.

17. The article of manufacture of claim 15, wherein the data representing the integrated circuit layout further comprises a second root network connecting to the respective first plurality of switching networks and connecting to the respective second plurality of switching networks, wherein a plurality of pins of a first port are connected to pins of a plurality of ports of a first plurality of ports of the second root network, the first plurality of ports of the respective first plurality of switching networks, and the first plurality of ports of the respective second plurality of switching networks of the second root network.

18. The article of manufacture of claim 15, wherein a first network of the third plurality of switching networks comprises a programmable logic cell.

19. The article of manufacture of claim 15, wherein a second network of the first plurality of switching networks and the second plurality of switching networks comprises a plurality of cells to perform at least one of a logic function and a storage function.

20. The article of manufacture of claim 15, wherein a plurality of pins of a respective port of the first plurality of ports of a first network of two cousin networks of the first plurality of switching networks, the second plurality of switching networks, and the third plurality of switching networks are connected to the pins of a respective port of the second plurality of ports of a parental network of a second network of the two cousin networks.

21. The article of manufacture of claim 15, wherein a plurality of pins of a respective port of the first plurality of ports of a first network of two tribal networks of the first plurality of switching networks, the second plurality of switching networks, and the third plurality of switching networks are connected to pins of a respective port of the second plurality of ports of a parental network of a second network of the two tribal networks.

* * * * *